United States Patent [19]
Liu

[11] Patent Number: 5,871,028
[45] Date of Patent: Feb. 16, 1999

[54] PHOTORESIST SOLUTION STORAGE AND SUPPLY DEVICE

[75] Inventor: Eric Liu, Hsinchu City, Taiwan

[73] Assignee: United Microelectronics Corporation, Taiwan

[21] Appl. No.: 757,673

[22] Filed: Nov. 29, 1996

[30] Foreign Application Priority Data

Aug. 6, 1996 [TW] Taiwan ................................ 85109548

[51] Int. Cl.[6] ............................ F16K 31/02; F16K 31/12
[52] U.S. Cl. .......................... 137/209; 137/392; 141/59; 141/65; 141/66; 396/632; 417/36; 417/44.1
[58] Field of Search ..................... 137/209, 356, 137/392; 396/626, 632; 417/36, 44.1, 45; 141/59, 65, 66

[56] References Cited

U.S. PATENT DOCUMENTS

| | | | |
|---|---|---|---|
| 3,049,887 | 8/1962 | Sharp | 137/392 |
| 3,222,578 | 12/1965 | Thiele | 137/392 |
| 3,626,970 | 12/1971 | Jones | 137/392 |
| 4,398,554 | 8/1983 | Kondo | 137/209 |
| 4,841,321 | 6/1989 | Kose et al. | 137/392 |
| 4,859,375 | 8/1989 | Lipisko et al. | 137/209 |

*Primary Examiner*—George L. Walton
*Attorney, Agent, or Firm*—Rabin & Champagne, P.C.

[57] ABSTRACT

A photoresist storage and supply device. The device includes a control unit for generating a number of on/off signals. A number of gas supply valves are open to let gas pass according to the on/off signals. A number of photoresist solution storage vessels store photoresist solution and receive the gas from a corresponding gas supply valve. A buffer vessel receives the photoresist solution, under pressure of the gas, from a selected photoresist solution storage vessel. A liquid level sensor mounted on the buffer vessel detects the solution level in the buffer vessel and generates a control signal when the photoresist solution level in the buffer vessel is below a certain threshold. A gas exhaust valve is coupled to the control unit, and expels gas from inside the buffer vessel according to an on/off signal.

7 Claims, 3 Drawing Sheets

PHOTORESIST SOLUTION STORAGE AND SUPPLY DEVICE

BACKGROUND OF THE INVENTION

1. Field of the Invention

The invention relates in general to a device used in a photolithographic integrated circuit fabrication process, and more particularly to a photoresist solution storage and supply device that can reduce photoresist solution waste.

2. Description of the Related Art

Photolithography has become one of the most important techniques in the semiconductor manufacturing industry. For instance, various patterns on thin film component layers, as well as areas for implantation of impurities, are defined using photolithographic processes. In fact, the ability to increase the level of integration of semiconductor components is related to whether component dimensions can be reduced, and dimensional reduction depends very much on the progress of photolithographic techniques.

A photolithographic process involves first coating a layer of photosensitive material, commonly called photoresist, over the silicon chip, and then, with an intermediate mask in place, exposing the layer to a light source. The mask is composed of light penetrable and non-penetrable areas arranged so that a pattern can be defined in the photoresist layer. Areas in the photoresist layer that have been exposed to light can be characterized as either soluble or insoluble types, according to the characteristic changes they undergo through reaction with developing solution. If, after exposure to light, the exposed area is soluble in the developer, leaving behind the unexposed area, then such photosensitive material is called positive photoresist, and the pattern so defined is the same as the one in the photomask. On the other hand, if after exposure to light, the exposed area is insoluble in the developer and the unexposed area is soluble, then this kind of photosensitive material is called negative photoresist, and the pattern so defined is complementary to the photomask.

Thus, a photolithographic process basically consists of three major steps, namely, photoresist coating, light exposure, and developing.

A conventional photoresist storage and supply device as shown in FIG. 1 includes a manually operated valve 8, a photoresist solution storage vessel 14, a liquid level sensor 16, a pump 20, a filtering device 24, gas pipelines 6, 12, 10, and liquid pipelines 18, 22, 26. A photoresist solution 15 is pumped by the pump 20 from the photoresist solution storage vessel 14 through the pipeline 18 until the liquid level sensor 16 has detected a predefined low liquid level situation, in which case the empty vessel needs to be replaced. The photoresist solution 15 from the pump 20 is sent via pipeline 22 to a filtering device 24, and then is passed on through the pipeline 26 into subsequent processing stages (for example, constant temperature setting) before a photoresist coating operation. A gas 5 (for example, nitrogen) is passed from the pipeline 6 through the manually operated valve 8 into the pipeline 10 and then enters into the photoresist solution storage vessel 14. Lastly, it is expelled through holes 24a in the filtering device 24.

The aforementioned conventional photoresist solution storage and supply device has several drawbacks, including the following:

(1) The liquid level sensor is hard to adjust and can easily lead to either waste caused by too much photoresist solution still remaining inside the vessel when it is replaced, or gas bubbling into the pipelines caused by over-extraction of photoresist solution, resulting in defective photoresist coatings on silicon chips.

(2) Machine operating time is wasted by replacing used photoresist solution storage vessels, as the machine must stop just to change the vessel.

(3) The gas valve must be operated manually to let gas in, forcing the photoresist solution to flow into the pipeline leading to the pump, and the gas is expelled through the exhaust holes in the filtering device.

SUMMARY OF THE INVENTION

It is therefore an object of the invention to provide a photoresist solution storage and supply device which does not require operation to be stopped in order to renew the photoresist solution.

It is another object of the invention to provide a photoresist storage and supply device which prevents waste of photoresist solution.

It is a further object of the invention to provide a photoresist storage and supply device which need not be stopped to change photoresist solution supply vessels.

It is an additional object of the invention to provide a photoresist storage and supply device which has valves that are operated automatically.

These and other objects and advantages of the invention are provided by a storage and supply device which includes a control unit for providing on/off signals to a number of valves to control opening and closing of the valves. At least one photoresist solution storage vessel is coupled to the gas supply valves, and is used as a storage area as well as a starting place for delivering photoresist solution through gas pressure. A buffer vessel is coupled to the photoresist solution storage vessel, and acts as a receiver and storage area for the photoresist solution, as well as a collector of the accompanying gas. A liquid level sensor is mounted on the side wall of the buffer vessel, and is used to detect and generate a control signal when the photoresist solution level in the buffer vessel is low. At least one gas exhaust valve is coupled to the control unit, and is used to expel gas from inside the buffer vessel according to the on/off signal.

According to another aspect of the invention, a photoresist solution storage and supply device is provided which includes a control unit for generating four on/off signals. A first gas supply valve is coupled to the control unit, and is opened to let gas pass according to the first on/off signal emitted from the control unit. A first photoresist solution storage vessel is coupled to the first gas supply valve, and is used to store and deliver photoresist solution through gas pressure when the first on/off signal is in an ON state. A second gas supply valve is coupled to the control unit, and is opened to let gas pass according to the second on/off signal generated by the control unit. A second photoresist solution storage vessel is coupled to the second gas supply valve, and is used to store and to deliver photoresist solution through gas pressure when the second on/off signal is in an ON state. A liquid dispensing valve is coupled to the control unit and has two inlets. One inlet is connected to the first photoresist solution storage vessel and the other is connected to the second photoresist solution storage vessel. Photoresist solution from either one of the two storage vessels is selected to pass photoresist solution according to the third on/off signal from the control unit. A buffer vessel is coupled to the liquid dispensing valve, and acts as a receiver and storage area for the photoresist solution, as well as a collector of the accompanying gas. A liquid level sensor mounted on the sidewall of the buffer vessel is used to detect the photoresist solution level in the buffer vessel and to generate a control signal when the photoresist solution level in the buffer vessel is low. A gas exhaust valve coupled to the control unit is used to expel gas from inside the buffer vessel, according to the fourth on/off signal.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1:
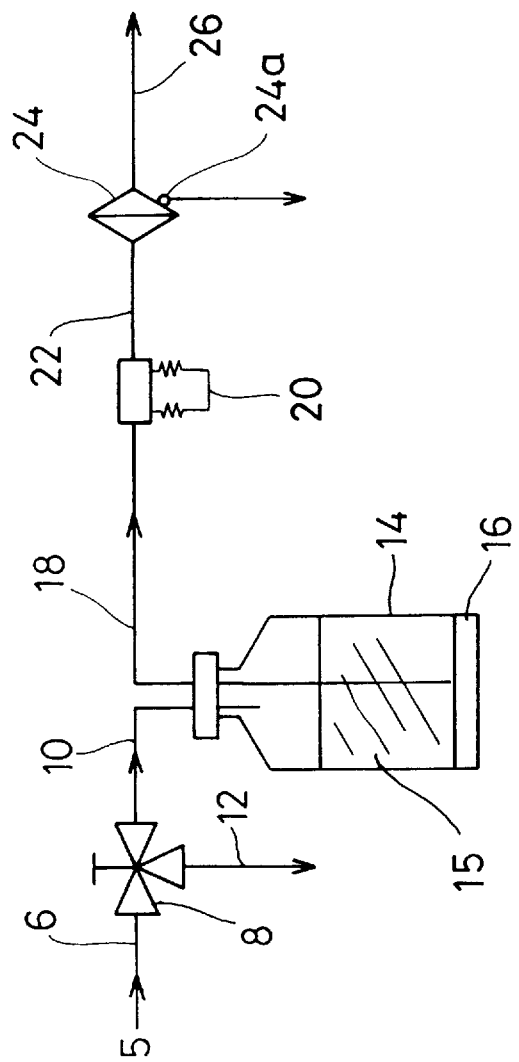
FIG. 1 shows a conventional photoresist solution dispensing device.
Figure 2:
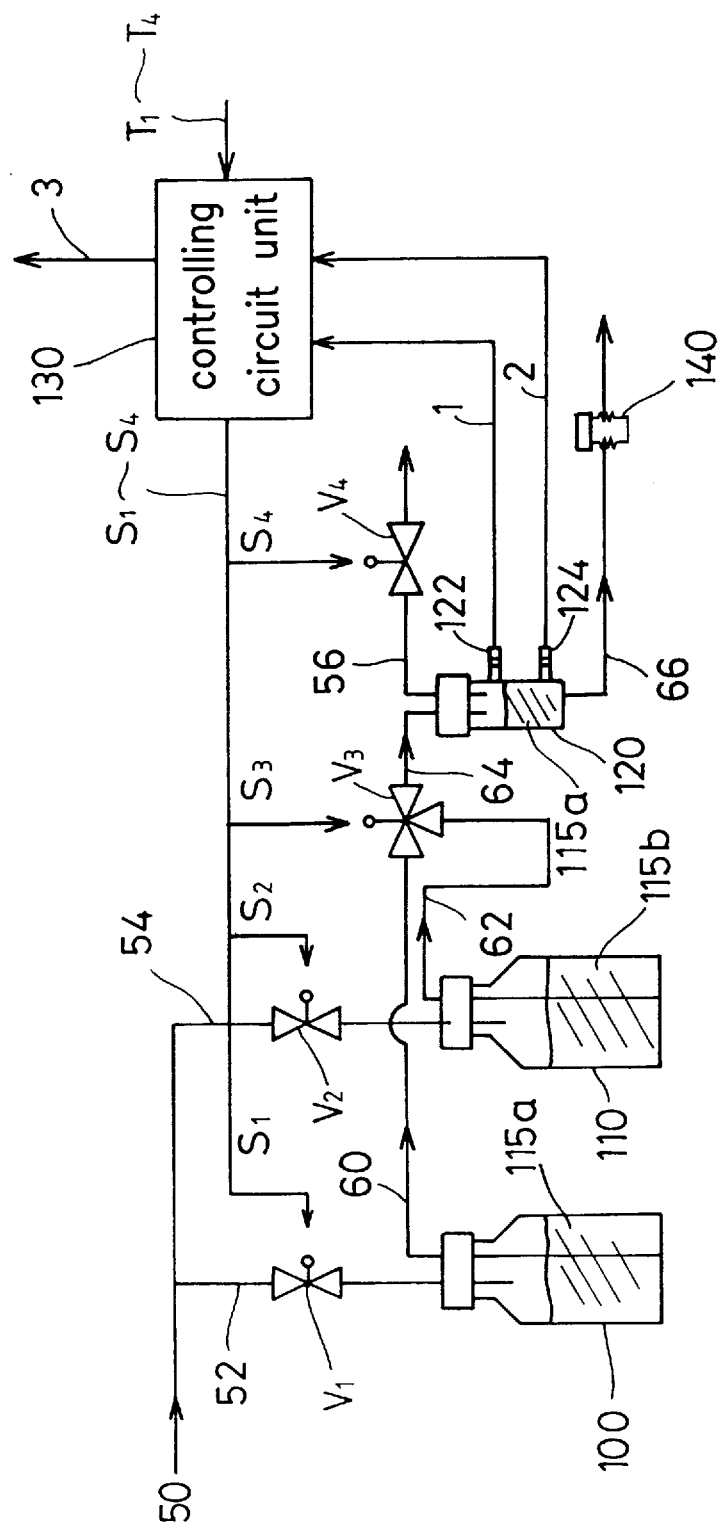
FIG. 2 shows a photoresist solution storage and supplying device according to a preferred embodiment of the invention.

FIG. 2 shows a photoresist solution storage and supply device according to a preferred embodiment of the invention. The device includes a control unit 130 for generating on/off signals $S_1$–$S_4$ and an alarm signal 3. A first gas supply valve $V_1$ is electrically coupled to the control unit 130 to receive the on/off signals $S_1$, and performs opening and closing operations to enable a gas 50 under constant pressure, such as nitrogen, to pass through a pipeline 52. A first photoresist solution storage vessel 100 is coupled to the first gas supply valve $V_1$, and stores photoresist solution 115a. The first vessel 100 also receives nitrogen gas at constant pressure when the on/off signal $S_1$ is in the ON state so that the photoresist solution 115a is expelled through a pipeline 60. A second gas supply valve $V_2$ is electrically coupled to the control circuit unit 130 to receive on/off signal $S_2$, and performs opening and closing operations to enable the gas 50 to pass through a pipeline 54. A second photoresist solution storage vessel 110 is coupled to the second gas supply valve $V_2$, and stores photoresist solution 115b. The second vessel also receives the gas 50 under constant pressure when the on/off signal $S_2$ is in the ON state, so that the photoresist solution 115b is expelled through a pipeline 62. A two-way liquid distribution valve $V_3$ has inlets coupled to the pipeline 60 and the pipeline 62, respectively, so that either the photoresist solution 115a coming through the pipeline 60 or the photoresist solution 115b coming through the pipeline 62 is selected, according to the on/off signal $S_3$ being received. For example, if the solution 115a is selected, then the photoresist solution 115a is passed on from the valve $V_3$ outlet through pipeline 64. A buffer vessel 120 is coupled by the pipeline 64 to the two-way liquid distribution valve $V_3$, and receives and stores the photoresist solution 115a, which is expelled through a pipeline 66. A gas exhaust valve $V_4$ is coupled by a pipeline 56 to the buffer vessel 120 to carry out opening and closing operations to allow exhaust gas to pass from the buffer vessel 120 when the proper electrical on/off signal $S_4$ is received from the control unit. A first liquid level sensor 122 is placed on the sidewall of the buffer vessel 120, for detecting the liquid level of the photoresist solution inside the buffer vessel 120 and for sending out a control signal 1 to the control unit 130. When the first liquid level sensor 122 detects a liquid level dropping below a threshold, the control signal 1 causes the control unit to shut valves $V_1$ (or $V_2$) and $V_4$. When the first liquid level sensor 122 does not detect a liquid level (such as when the liquid level drops below the level of the first liquid level sensor 122), the control signal 1 emitted enables $V_1$ (or $V_2$) and $V_4$ to reopen again. A second liquid level sensor 124 is also placed on the sidewall of the buffer vessel 120, but below the first liquid level sensor 122. The second sensor 124, therefore, has a lower threshold, indicating that the buffer vessel 120 is nearly empty. The function of the second liquid level sensor is exactly the same as that of the first liquid level sensor 122, that is, to sense the liquid level of the photoresist solution within the buffer vessel 120 and to send out a control signal 2. The second liquid level sensor acts not only as a substitute for the first liquid level sensor in case of failure, it also shuts down the machine temporarily to avoid empty suction.

The device also includes a pump 140 coupled to the buffer vessel 120 through a pipeline 66, for pumping out photoresist solution 115a or 115b. After a suitable treatment, such as filtering or heating (not shown in the figure), the photoresist solution is sent to the wafer coating area. Furthermore, the device can supply a group of coating wafers simultaneously, for example, by including more pipelines (not shown in the Figure) in addition to the original pipeline 66 from the buffer vessel 120, to achieve the goal of a single device supporting multiple wafer coatings.

Figure 3:
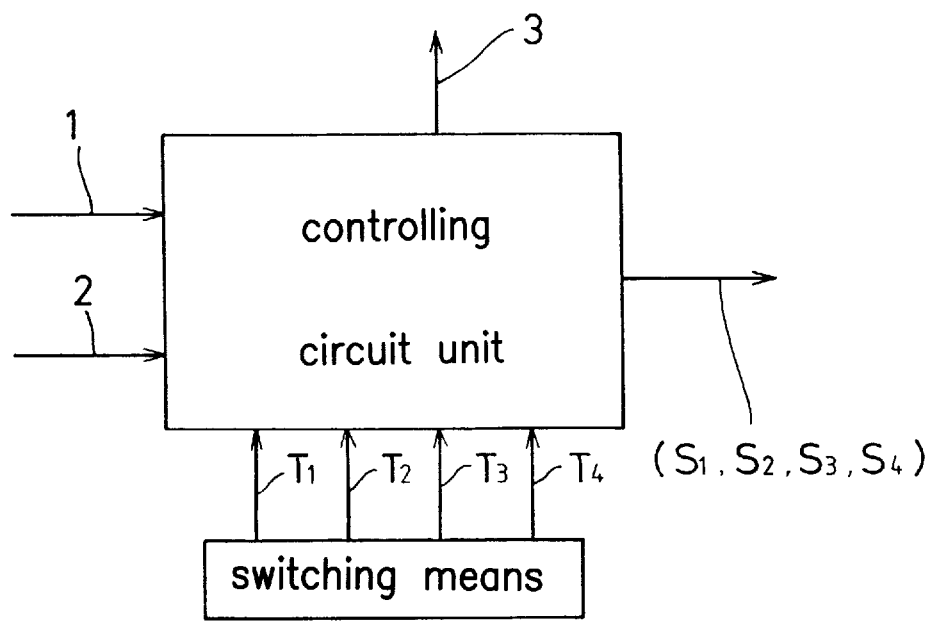
FIG. 3 shows a control unit according to the invention.

FIG. 3 shows a control unit according to the invention. Four timing parameters are programmed into the unit by a switching device. These timing parameters are: (1) an opening time $T_1$ for the first gas supply valve (or the second gas supply valve); (2) a delay shutdown time $T_2$ for the first gas supply valve (or the second gas supply valve); (3) a delay shutdown time $T_3$ for the fourth gas supply valve after shutdown of the first gas supply valve (or the second gas supply valve); and (4) an allowed shutdown time period $T_4$ for the first liquid level sensor.

$T_1$, $T_2$, $T_3$, and $T_4$ are utilized in relation to the control signal 1 generated by the first liquid level sensor to send out controlling signals $S_1$, $S_2$, $S_3$, and $S_4$ for all valve opening and closing operations.

The following TABLE 1 shows how the control signal 1 from the first liquid level sensor 122, in combination with the timing parameters $T_1$, $T_2$, $T_3$, and $T_4$ as described above, acts to control the opening and closing operations of the valves $V_1$, $V_2$, $V_3$, and $V_4$. The first liquid level sensor 122 generates an "OFF" signal when the liquid level falls below the first liquid level sensor 122 position, and it generates an "ON" signal when the liquid level rises above the first liquid level sensor 122 position.

TABLE 1

| STAGE | STEP | FIRST LIQUID LEVEL SENSOR | $V_1$ | $V_2$ | $V_3$ 100* | $V_3$ 110* | $V_4$ | REMARK |
|---|---|---|---|---|---|---|---|---|
| I | 1 | off | on | off | on | off | on | — |
|   | 2 | on | off | off | on | off | off | (a) |
|   | 3 | off | on | off | on | off | on | — |
|   | 4 | on | off | off | on | off | off | (a) |
| II | 5 | off (T > $T_1$) | off | on | off | on | on | (b) |
|   | 6 | on | off | off | off | on | off | (c) |
|   | 7 | off | off | on | off | on | on | — |
|   | 8 | on | off | off | off | on | off | (c) |

TABLE 1-continued

| STAGE | STEP | FIRST LIQUID LEVEL SENSOR | $V_1$ | $V_2$ | $V_3$ 100* | $V_3$ 110* | $V_4$ | REMARK |
|---|---|---|---|---|---|---|---|---|
| III | 9 | off (T > $T_1$) | on | off | on | off | on | (d) |
|  | 10 | off (T > $T_1$) | off | on | off | on | on | (e) |
|  | 11 | off (T > $T_1$) | on | off | on | off | on | (f) |

REMARKS:
(a) $V_1$ shutoff after delay $T_2$, and then $V_4$ shutoff after delay $T_3$.
(b) Photoresist solution 100 judged to be empty, alarm signal 3 asserted to remind of need for replacement.
(c) $V_2$ shutoff after delay $T_2$, and then $V_4$ shutoff after delay $T_3$.
(d) Photoresist solution 110 judged to be empty, alarm signal 3 asserted to remind of need for replacement.
(e) Photoresist solution 100 not yet replaced.
(f) Photoresist solution 110 not yet replaced → machine shutdown.
Notes:
*100: represents the terminal connected to the first photoresist storage vessel 100;
*110: represents the terminal connected to the second photoresist storage vessel 110.

The above TABLE 1 shows the operating procedures of the device. Under normal operation, the device operates by alternating between stage I and stage II. That is, the photoresist solution 115a is supplied by the photoresist solution storage vessel 100 until the supply is depleted, then the photoresist solution 115b is supplied by the photoresist solution storage vessel 110, and at the same time an alarm signal 3 is generated to remind that the vessel 100 needs replacement. When the photoresist solution inside the photoresist solution storage vessel 110 is depleted, the photoresist solution is supplied by photoresist solution storage vessel 100 again, and at the same time an alarm signal 3 is emitted to remind that the vessel 110 needs replacement. Only when the photoresist solution in both vessels 100 and 110 is depleted without replacement, a machine stopping state is entered, accompanied by an alarm signal (stage III).

The purpose of setting up the allowed shutdown time period $T_4$ for the first liquid level sensor 122 and the additional second liquid level sensor 124 is to safeguard against possible malfunctioning of normal execution, and to lead to the photoresist solution (either 115a or 115b) inside the buffer vessel 120 being pumped empty, reducing waste.

In summary, the invention includes a control unit, a buffer vessel, and at least one photoresist solution storage vessel, and provides the following advantages:

(1) there is no need to stop the machine to renew the photoresist solution, thereby increasing productivity;

(2) photoresist solution is not wasted, cutting down on costs;

(3) bubble generation is prevented and thus defective photoresist coating is avoided;

(4) an automatic gas exhaustion function is provided; and (5) the multi-pipeline distribution design saves space.

While the invention has been described by way of example and terms of a preferred embodiment, it is to be understood that the invention is not limited thereto. To the contrary, it is intended to cover various modifications and similar arrangements. The scope of the appended claims, therefore, should be accorded the broadest interpretation so as to encompass all such modifications and similar arrangements.

What is claimed is:

1. A photoresist storage and supply device, comprising:
a control unit for generating at least an on/off signal;
at least one gas supply valve having an outlet to which gas passes when the at least one gas supply valve is open, according to the at least an on/off signal;
at least one photoresist solution storage vessel, coupled to the at least one gas supply valve, for storing photoresist solution;
a buffer vessel coupled to the at least one photoresist solution storage vessel, for receiving photoresist solution from the at least one photoresist solution storage vessel and for storing the received photoresist solution, wherein photoresist solution is delivered from the at least one photoresist solution storage vessel to the buffer vessel under pressure of the gas when the at least one gas supply valve is open;
a liquid level sensor mounted on the buffer vessel, for detecting a level of the photoresist solution in the buffer vessel and for generating a low-level control signal when the photoresist solution level in the buffer vessel is below a predetermined low-level threshold; and
at least one gas exhaust valve for expelling gas from inside the buffer vessel according to the at least an on/off signal.

2. A device according to claim 1, further including at least one liquid supply valve disposed between the at least one photoresist solution storage vessel and the buffer vessel, for receiving photoresist solution from the at least one photoresist solution storage vessel and for providing the photoresist solution to the buffer vessel according to the at least an on/off signal.

3. A device according to claim 1, further including a pump coupled to the buffer vessel, for pumping photoresist solution to a wafer coating area.

4. A device according to claim 1, further including a limit sensor mounted on the buffer vessel, for detecting a level of the photoresist solution in the buffer vessel and for generating an empty control signal when the photoresist solution level in the buffer vessel is below a predetermined empty threshold that is lower then the low-level threshold.

5. A photoresist solution storage and supply device, comprising:
a control unit for generating first, second, third, and fourth on/off signals;
a first gas supply valve having an outlet to which gas passes when the first gas supply valve is open, according to the first on/off signal;
a first photoresist solution storage vessel, coupled to the first gas supply valve, for storing first photoresist solution;
a second gas supply valve having an outlet to which the gas passes when the second gas supply valve is open, according to the second on/off signal;
a second photoresist solution storage vessel, coupled to the second gas supply valve, for storing additional photoresist solution;
a liquid dispensing valve having first and second inlets, wherein the first inlet is coupled to the first photoresist solution storage vessel for receiving the first photoresist solution and the second inlet is coupled to the second photoresist solution storage vessel for receiving the additional photoresist solution, and wherein either the first inlet or the second inlet is selected for fluid communication with the outlet, according to the third on/off signal, such that the outlet is enabled to provide selected photoresist solution;
a buffer vessel for receiving the selected photoresist solution from the outlet of the liquid dispensing valve, and for storing the received photoresist solution, wherein the first photoresist solution is delivered from the first photoresist storage vessel to the buffer vessel, under pressure of the gas, when the first gas supply valve is open and the first inlet of the liquid dispensing valve is in fluid communication with the outlet of the liquid dispensing valve, and the additional photoresist solution is delivered from the second storage vessel to the buffer vessel, under pressure of the gas, when the second gas supply valve is open and the second inlet of the liquid dispensing valve is in fluid communication with the outlet of the liquid dispensing valve;

a liquid level sensor mounted on the buffer vessel for detecting a level of the received photoresist solution in the buffer vessel and for generating a low-level control signal when the received photoresist solution level in the buffer vessel is below a predetermined low-level threshold; and a gas exhaust valve for expelling the gas from inside the buffer vessel, according to the fourth on/off signal.

6. A device according to claim 5, further including a pump coupled to the buffer vessel, for pumping the received photoresist solution to wafer coating area.

7. A device according to claim 5, further including a limit sensor mounted on the buffer vessel, for detecting a level of the received photoresist solution in the buffer vessel and for generating an empty control signal when the received photoresist solution level in the buffer vessel is below a predetermined empty threshold that is lower then the low-level threshold.

* * * * *